(12) United States Patent
Park

(10) Patent No.: US 7,183,174 B2
(45) Date of Patent: Feb. 27, 2007

(54) FLASH MEMORY DEVICE AND METHOD OF MANUFACTURING THE SAME

(75) Inventor: Sung Kee Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/169,893

(22) Filed: Jun. 30, 2005

(65) Prior Publication Data

US 2006/0255394 A1    Nov. 16, 2006

(30) Foreign Application Priority Data

May 11, 2005   (KR) .................... 10-2005-0039445

(51) Int. Cl.
*H01L 21/76* (2006.01)
(52) U.S. Cl. ............ 438/424; 257/314; 257/E21.68; 438/257; 438/258; 438/287
(58) Field of Classification Search ......... 257/E21.68, 257/314; 438/257, 258, 287, 424
See application file for complete search history.

(56) References Cited

U.S. PATENT DOCUMENTS

| | | | | | |
|---|---|---|---|---|---|
| 5,506,160 | A | * | 4/1996 | Chang ..................... | 438/258 |
| 5,896,315 | A | * | 4/1999 | Wong ..................... | 365/185.01 |
| 5,962,888 | A | * | 10/1999 | Kim et al. ................. | 257/315 |
| 6,143,608 | A | * | 11/2000 | He et al. ................... | 438/264 |
| 6,327,695 | B1 | * | 12/2001 | Bothra et al. .............. | 716/8 |
| 6,438,030 | B1 | * | 8/2002 | Hu et al. .................. | 365/185.18 |
| 6,476,445 | B1 | * | 11/2002 | Brown et al. .............. | 257/347 |
| 6,603,162 | B1 | * | 8/2003 | Uchiyama et al. .......... | 257/296 |
| 6,759,706 | B2 | * | 7/2004 | Kobayashi ................. | 257/314 |
| 7,019,348 | B2 | * | 3/2006 | Tu ........................... | 257/301 |
| 2001/0000625 | A1 | * | 5/2001 | Yaegashi et al. ............ | 257/296 |
| 2004/0041202 | A1 | * | 3/2004 | Kim et al. ................. | 257/316 |
| 2004/0207412 | A1 | * | 10/2004 | Kunikiyo et al. ........... | 324/679 |
| 2005/0020088 | A1 | * | 1/2005 | Trivedi ..................... | 438/700 |

* cited by examiner

*Primary Examiner*—Michelle Estrada
*Assistant Examiner*—Jarrett J. Stark
(74) *Attorney, Agent, or Firm*—Mayer Brown Rowe & Maw LLP

(57) ABSTRACT

A flash memory device and method of manufacturing the same. The flash memory device includes a semiconductor substrate in which a first region where a cell region is formed, a second region where a peripheral region is formed, and a third region formed in the peripheral region at the boundary portion of the cell region and the peripheral region. The device also includes a triple well region formed in the first region and a predetermined region of the third region, an isolation film formed in the first region and having a first depth, an isolation film formed in the second region and having a second depth, which is deeper than the first depth of the isolation film, and a gate oxide film for low voltage and a floating gate, which are stacked on a predetermined region of the first region, a gate oxide film and a gate, which are stacked on a predetermined region of the second region. Additionally, the device includes a dummy flash memory cell in which the floating gate formed in the first region and the gate formed in the second region are separated from each other, and a gate oxide film for high voltage and a gate electrode are stacked on a predetermined region of the third region.

13 Claims, 3 Drawing Sheets

FLASH MEMORY DEVICE AND METHOD OF MANUFACTURING THE SAME

BACKGROUND

1. Field of the Invention

The present invention relates to semiconductor devices and method of manufacturing the same. More specifically, the present invention relates to a flash memory device and method of manufacturing the same.

2. Discussion of Related Art

Generally, as the size of a NAND flash memory device shrinks, a depth of an isolation film in a cell region and a depth of an isolation film in a peripheral region in an isolation film formation process have to be different from each other.

At a boundary portion of the cell region and the peripheral region, the isolation film has a dual depth. In a NAND flash memory, in the case where an isolation film, having a dual depth at a well boundary portion, is formed, the following problems are generated.

First, when forming an isolation film necessary for each of a cell region and a peripheral region, a semiconductor substrate is etched in a dual manner, causing damage to the semiconductor substrate. Thus, there is a problem in that a leakage current path is formed to increase the leakage current.

Second, in a process of forming an isolation film required in each of the cell region and the peripheral region, a dummy active region is required. The dummy active region is formed at a well region boundary portion of the cell region or within a deep N well. In an erase operation of a device, however, a parasitic transistor is formed in the dummy active region according to a bias state. This becomes problematic in reducing a threshold voltage of the device.

Accordingly, there is a need for technologies capable of solving problems generated by an isolation film having a dual depth at a boundary portion of a cell region and a peripheral region is formed.

SUMMARY OF THE INVENTION

Accordingly, the present invention has been made in view of the above problems, and it is an object of the present invention to provide a flash memory device and method of manufacturing the same, wherein problems generated by an isolation film having a dual depth at a boundary portion of a cell region and a peripheral region can be obviated.

To achieve the above object, according to an aspect of the present invention, there is provided a method of manufacturing a flash memory device, including providing a semiconductor substrate in with a first region where a cell region is formed, a second region where a peripheral region is formed, and a third region formed in the peripheral region at the boundary portion of the cell region and the peripheral region. The method further includes performing an ion implant process to form a triple well region in a predetermined region of the first region, wherein an end portion of the triple well region is also formed in the third region, forming a gate oxide film for high voltage on the semiconductor substrate of the third region, forming a pattern for defining an isolation film of the cell region in the first region and a predetermined region of the third region, and forming a first trench only in the first region through patterning using the pattern, forming patterns for defining isolation films of the peripheral region in predetermined regions of the second and third regions, performing patterning through the pattern to form a second trench deeper than the first trench only in the second region, wherein in the patterning for forming the first and second trenches, a dummy active region is formed in the third region in which the patterning is prevented, and forming an insulating film for trench burial only within the first and second trenches, thus forming a first isolation film in the first region and a second isolation film, which is deeper than the first isolation film, in the second region. The method also includes forming a gate oxide film for low voltage on the entire surface except for the dummy active region, and forming a first polysilicon film for floating gate electrode on the entire surface, patterning the first polysilicon film to form a floating gate electrode in the first region and a patterned polysilicon film in the third region, wherein the gate oxide film for high voltage and the patterned polysilicon film are stacked on the dummy active region.

In embodiments, the triple well region may include a deep N well region, a P well region formed in a predetermined region of the deep N well region, and a N well region formed adjacent to the P well region.

In embodiments, the P well region of the triple well region may be located in the third region.

In embodiments, the dummy active region may be shifted about 0.1 to 0.5 μm toward the peripheral region at a boundary portion of the cell region and the peripheral region.

The gate oxide film for high voltage may, in embodiments, be formed to a thickness of 360 to 440 Å.

A well region for the peripheral region may, in embodiments, be formed within the semiconductor substrate of a predetermined region of the peripheral region.

In embodiments, the method may further include forming a field stop well region within the semiconductor substrate of the peripheral region between the well region for the peripheral region and the triple well region of the cell region.

According to an aspect of the present invention, there is provided a flash memory device, including a semiconductor substrate in which a first region where a cell region is formed, a second region where a peripheral region is formed, and a third region formed in the peripheral region at the boundary portion of the cell region and the peripheral region, a triple well region formed in the first region and a predetermined region of the third region, an isolation film formed in the first region and having a first depth, an isolation film formed in the second region and having a second depth, which is deeper than the first depth of the isolation film, a gate oxide film for low voltage and a floating gate, which are stacked on a predetermined region of the first region, a gate oxide film and a gate, which are stacked on a predetermined region of the second region, and a dummy flash memory cell in which the floating gate formed in the first region and the gate formed in the second region are separated from each other, and a gate oxide film for high voltage and a gate electrode are stacked on a predetermined region of the third region.

In embodiments, a triple well region having a deep N well region and a P well region formed in a predetermined region of the deep N well region, and a N well region formed adjacent to the P well region can be formed in the cell region.

The P well region of the triple well region may, in embodiments, be located in the third region.

The flash memory device may, in embodiments, further include a well region for a peripheral region, which is formed within the semiconductor substrate of a predetermined region of the peripheral region.

In embodiments, the flash memory device may further include a field stop well region within the semiconductor substrate of the peripheral region between the well region for the peripheral region and the triple well region of the cell region.

DETAILED DESCRIPTION OF PREFERRED EMBODIMENTS

Figure 1:
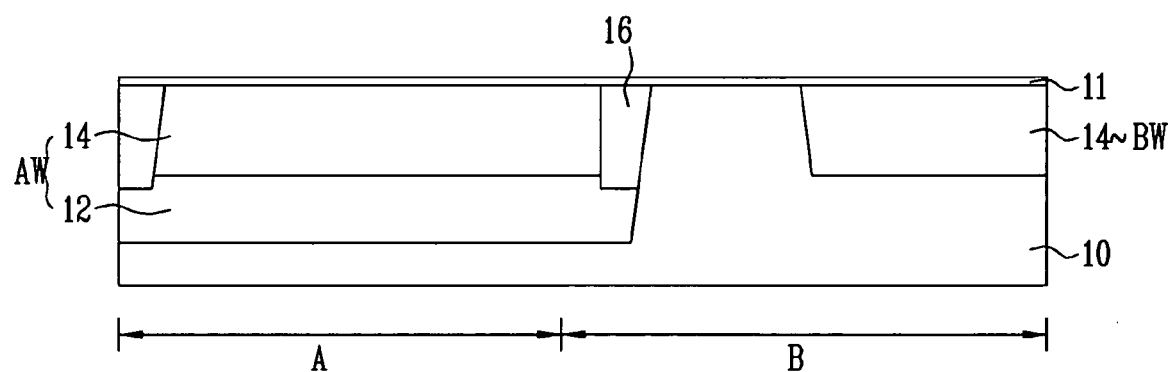
FIGS. 1 to 6 are cross-sectional views for explaining a method of manufacturing a flash memory device according to an embodiment of the present invention.

Embodiments according to the present invention will be described with reference to the accompanying drawings. Since the embodiments are provided so that a person of ordinary skill in the art will be able to understand the present invention, the embodiments may be modified in various manners and the scope of the present invention is not limited by the embodiments described herein. In cases where it is described that one film is "on" the other film or a semiconductor substrate, the one film may directly contact the other film or the semiconductor substrate or a third film may be intervened between the one film and the other film or the semiconductor substrate. Furthermore, in the drawings, the thickness and size of each layer are exaggerated for convenience of explanation and clarity. Like reference numerals are used to identify the same or similar parts.

FIGS. 1 to 6 are cross-sectional views for explaining a method of manufacturing a flash memory device according to an embodiment of the present invention.

Referring to FIG. 1, a screen oxide film 11 is formed on the entire surface of a semiconductor substrate 10 in which a cell region A and a peripheral region B are defined.

The screen oxide film 11 can be formed to a thickness of about 80 Å. The screen oxide film serves to prevent stress applied by a pad nitride film, which is formed in a process of defining an isolation film, to the semiconductor substrate. The screen oxide film also serves to prevent a channeling phenomenon generated in an ion implant process for forming a well region, etc.

A process of forming a well region AW in the cell region A and a process of forming a well region BW in the peripheral region B are performed. The well region AW of the cell region A is also formed in the peripheral region B at the boundary portion of the cell region A and the peripheral region B as well as a predetermined region of the cell region A.

More particularly, after a pattern through which the cell region A and only a predetermined region of the peripheral region B (the peripheral region B refers to the peripheral region at the boundary portion of the cell region A and the peripheral region B) are exposed is formed, an ion implant process is performed to form a deep N well region 12 in the cell region A and a predetermined region of the peripheral region B. The formed pattern is removed. After patterns for exposing the cell region A and a predetermined region of the peripheral region B are formed, an ion implant process is performed to form P wells 14 in a predetermined region where the deep N well region 12 of the cell region A is formed and a predetermined region of the peripheral region B. Thereby, formation of the well region BW in the peripheral region is completed.

Thereafter, the formed patterns are removed, and a pattern through which a predetermined region of the cell region A where the P well is formed is exposed is then formed. An ion implant process is performed to form an N well 16 in a region adjacent to the P well of the cell region A. Formation of a triple well region AW being the well region of the cell region is thereby completed.

Therefore, the triple well region AW being the well region of the cell region is also formed in the peripheral region at the boundary portion of the cell region and the peripheral region as well as the cell region A.

Figure 2:
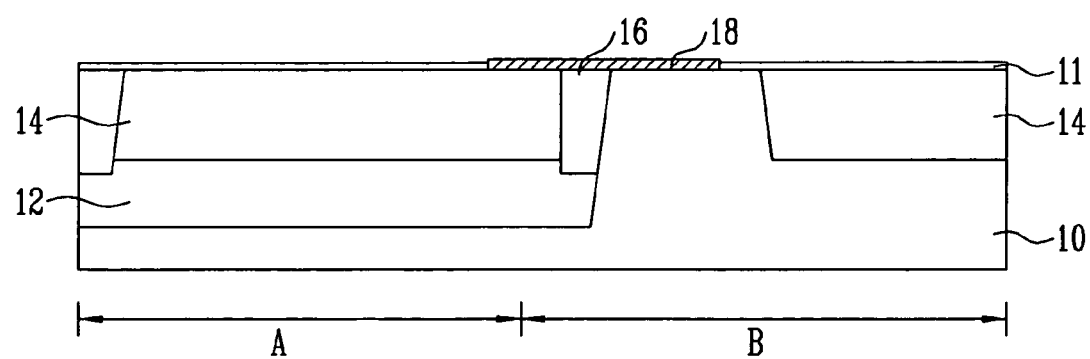

Referring to FIG. 2, a gate oxide film for high voltage 18 is formed in a predetermined region of the semiconductor substrate in which the well regions AW and BW are formed.

The gate oxide film for high voltage 18 is a gate oxide film that will be used in a dummy active region (FIG. 4), which will be formed later. The oxide film 18 is formed at a predetermined region from the boundary portion of the peripheral region B and the cell region A toward the peripheral region B.

The gate oxide film for high voltage 18 can be formed to a thickness of about 360 to 440 Å.

Figure 3:
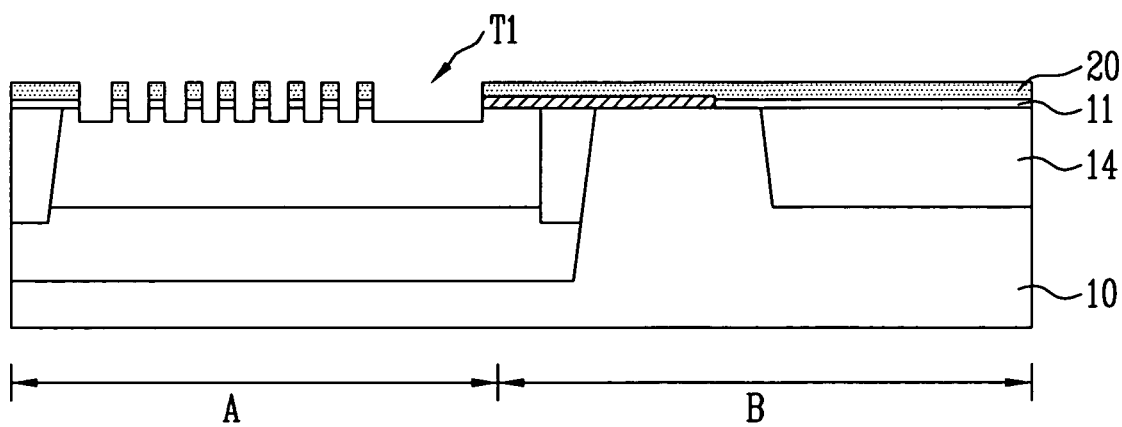

Referring to FIG. 3, a pad nitride film 20 is formed on the entire surface including the gate oxide film for high voltage 18. A photoresist pattern (not shown) through which only a region where an isolation film of the cell region will be formed is exposed is then formed. A predetermined depth of the pad nitride film 20, the screen oxide film 11 and the semiconductor substrate is etched using the pattern as an etch mask, forming a first trench Ti in the cell region A. A strip process for stripping a photoresist pattern (not shown) where a first trench will be defined is then performed.

The first trench T1 is an isolation film that will be defined in the cell region A, and the peripheral region B is covered with the photoresist pattern (not shown) in the process of forming the first trench.

Figure 4:
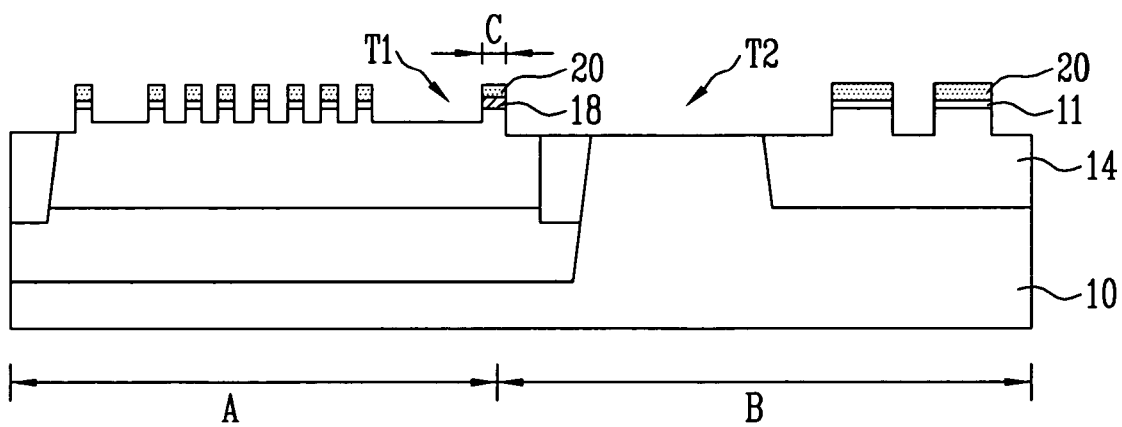

Referring to FIG. 4, a photoresist pattern (not shown), through which only a region where an isolation film of the peripheral region B will be formed is exposed, is formed on the result where the first trench T1 is formed. A predetermined depth of the pad nitride film 20, the screen oxide film 11 and the semiconductor substrate is etched using the pattern as an etch mask, forming a second trench T2 in the peripheral region B. A strip process of stripping the photoresist pattern (not shown) in which the second trench will be defined is then performed.

At this time, the second trench T2 is an isolation film that will be formed in the peripheral region B, and is deeper than the first trench T1 formed in the cell region. Furthermore, in the process of forming the second trench, the cell region B is covered with the photoresist pattern (not shown).

After the process of forming the second trench T2, a dummy active region C is defined close to the peripheral region B among the boundary portion of the peripheral region B and the cell region A. The dummy active region C is formed in a region which shifts from the boundary portion of the peripheral region B and the cell region A toward the peripheral region by about 0.1 to 0.5 μm.

The dummy active region C is a region where the photoresist pattern (not shown) for defining the first trench and the photoresist pattern (not shown) for defining the second trench are overlapped. In the etch process for forming the first trench and the etch process for forming the second trench, the dummy active region C is covered with the photoresist patterns. It is thus possible to protect the boundary portion of the cell region and the peripheral region from the etch processes for forming the first and second trenches.

In the prior art, when forming an isolation film necessary for each of a cell region and a peripheral region, a semiconductor substrate is etched in a dual manner, whereby the semiconductor substrate is damaged. The damaged semiconductor substrate is further damaged by means of a subsequent thermal process. As such, there is a problem in that a leakage current path is formed which increases the leakage current.

In the present invention, the semiconductor substrate is masked with the photoresist patterns in the etch process for forming the first trench and the etch process for forming the second trench. It is thus possible to protect the semiconductor substrate at the boundary of the cell region and the peripheral region from the etch processes for forming the first and second trenches. Accordingly, increase of the leakage current, which is caused by damage of a semiconductor substrate, can be prevented.

Further, the formed gate oxide film for high voltage 18 remains in the dummy active region C after being patterned.

The dummy active region C is also formed on the P well 14 among the triple well region AW of the cell region. If the dummy active region C is formed on the P well 14, the leakage current of a parasitic transistor, which is generated in an erase operation of a device, can be prevented by means of the deep N well 12 and the P well 14 of the cell region.

In the prior art, if the dummy active region is formed in the well region boundary portion of the cell region or within the deep N well, a parasitic transistor is formed in the dummy active region according to a bias state in an erase operation of a device. Thus, there is a problem in that a threshold voltage of a device is reduced.

According to the present invention, the dummy active region C is formed on the P well 14 of the triple well region AW, i.e., on the active region in which the transistor is formed. This does not affect a parasitic transistor generated in an erase operation of a device, and can prevent the leakage current of the parasitic transistor from occurring.

Figure 5:
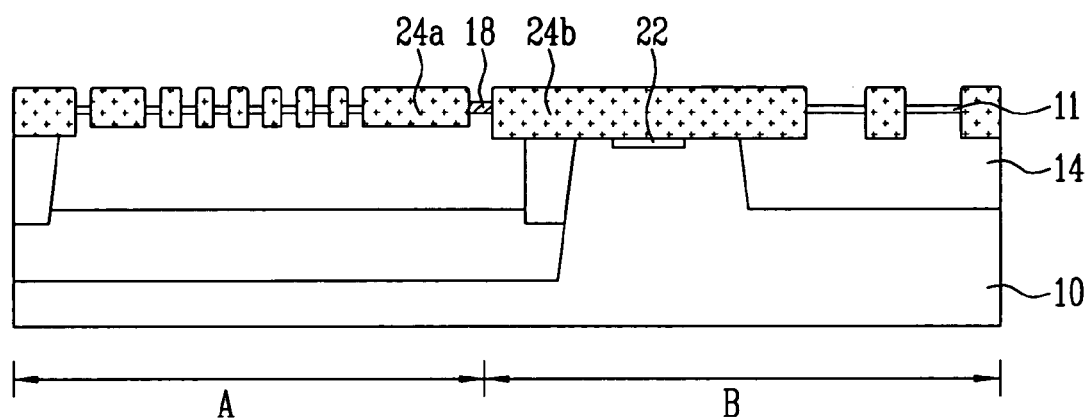

Referring to FIG. 5, a photoresist pattern (not shown) for forming a field stop well is formed on the result in which the second trench T2 is formed so that the semiconductor substrate of the peripheral region between the cell region BW of the peripheral region and the cell region AW of the cell region is exposed. An ion implant process using the pattern as a mask for ion implantation to form a field stop well region 22.

Thereafter, an insulating film for trench burial is formed on the entire surface where the field stop well region 22 is formed. A polishing process such as CMP is then performed until the pad nitride film 20 is exposed. Thereby, a first isolation film 24a is formed in the cell region A and a second isolation film 24b is formed in the peripheral region B. A process of stripping the pad nitride film and the screen oxide film is then performed.

Figure 6:
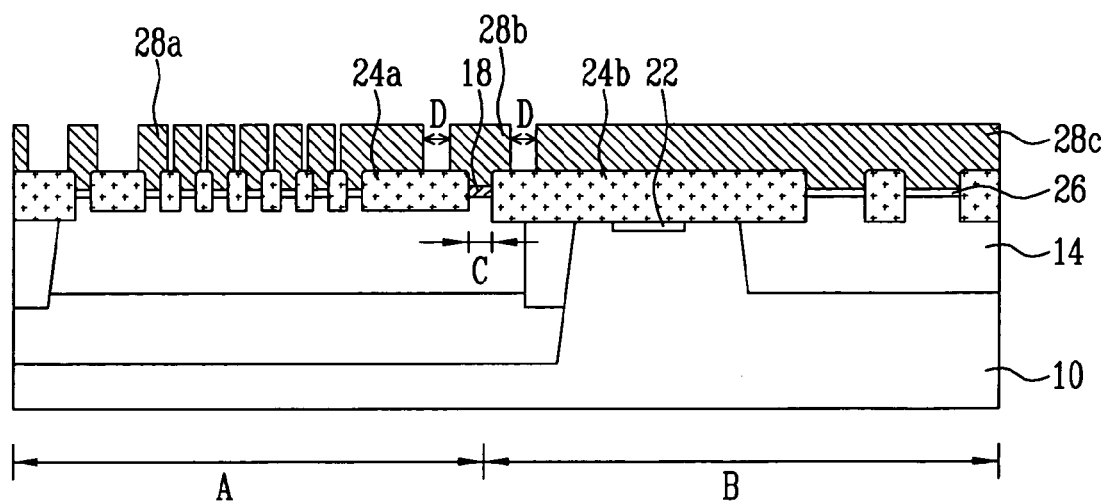

Referring to FIG. 6, a gate oxide film 26 for low voltage is formed in regions except for the dummy active region C among the results where the isolation films 24a and 24b are formed.

The gate oxide film for high voltage 18 remains on the dummy active region C after being patterned, and the gate oxide film 26 for low voltage is formed in the remaining regions.

Thereafter, a first polysilicon film for floating gate electrodes is formed on the results in which the gate oxide film 26 is formed. A photoresist pattern (not shown) for patterning the first polysilicon film is formed. An etch process using the pattern as an etch mask is then performed to form floating gate electrodes 28a in the cell region A, a patterned polysilicon film 28b on the dummy active region C and a gate electrode 28c in the peripheral region B.

At this time, in the process of forming the patterned polysilicon film 28b the first polysilicon film is etched so that the patterned polysilicon film 28b is formed to a predetermined width (FIG. 6D) at the right and left sides from the dummy active region C. Accordingly, the patterned floating gate electrodes 28a of the cell region A and the patterned polysilicon film 28b of the dummy active region C are separated from each other, and the patterned polysilicon film 28b is also separated from the gate electrode 28c formed in the peripheral region.

The flash memory device that is formed through a series of the processes according to the present invention includes the semiconductor substrate 10 in which the cell region A, the peripheral region B, and the peripheral region B at the boundary portion of the cell region A and the peripheral region B are defined, the triple well region AW formed in the cell region and the predetermined region of the peripheral region C at the boundary portion of the cell region and the peripheral region, the isolation film 24a formed in the cell region A and having a first depth, the isolation film 24b formed in the peripheral region C and having a second depth, which is deeper than the first depth of the isolation film 24a the gate oxide film 26 for low voltage and the floating gate 28a which are stacked on a predetermined region of the cell region, the gate oxide film 26 and the gate 28c which are stacked on a predetermined region of the peripheral region B, and the dummy flash memory cell, which is separated from the floating gate formed in the cell region and the gate formed in the peripheral region, wherein the gate oxide film 18 for high voltage and the gate 28b are stacked in the peripheral region C at the boundary portion of the cell region and the peripheral region.

Therefore, the gate oxide film 18 for high voltage and the floating gate electrodes 28b are formed in the dummy active region C, and a subsequent process of forming a dielectric film being an ONO film and a control gate electrode in the cell region is performed. Thus, since a dummy flash memory cell structure is formed in the dummy active region, the coupling ratio of the gate electrode of the flash memory device is reduced. A subsequent process is performed to prevent fail in the operation although the gate oxide film for high voltage is damaged.

As described above, according to the present invention, a semiconductor substrate is masked with photoresist patterns in an etch process for forming a first trench and an etch process for forming a second trench. It is thus possible to protect the semiconductor substrate at the boundary of a cell region and a peripheral region from the etch processes for forming the first and second trenches. Accordingly, there is an effect in that increase of the leakage current, which is caused by damage of a semiconductor substrate, can be prevented.

Further, according to the present invention, a dummy active region is formed on a P well of a triple well region AW, i.e., on an active region wherein a transistor is formed. This does not affect a parasitic transistor generated in an erase operation of a device. Accordingly, there is an effect in that the leakage current of a parasitic transistor is prevented from occurring.

Although the foregoing description has been made with reference to the above embodiments, it is to be understood that changes and modifications of the present invention may be made by a person of ordinary skilled in the art without departing from the spirit and scope of the present invention and appended claims.

What is claimed is:

1. A method of manufacturing a flash memory device, the method comprising:

providing a semiconductor substrate comprising a first region where a cell region is formed, a second region where a peripheral region is formed, and a third region formed in the peripheral region at the boundary portion of the cell region and the peripheral region;

performing a first ion implant process to form a triple well region in the semiconductor substrate of a predetermined region of the first region, wherein an end portion of the triple well region is also formed in the third region;

forming a gate oxide film for high voltage on the semiconductor substrate of the third region;

forming a pattern for defining an isolation film of the cell region in the first region and a predetermined region of the third region, and forming a first trench only in the first region through patterning using the pattern;

forming additional patterns for defining isolation films of the peripheral region in predetermined regions of the second and third regions, performing patterning through the additional patterns to form a second trench deeper than the first trench only in the second region, wherein in the patterning for forming the first and second trenches, a dummy active region is formed in the third region in which the patterning is prevented;

forming an insulating film for trench burial only within the first and second trenches, thus forming a first isolation film in the first region and a second isolation film, which is deeper than the first isolation film, in the second region;

forming a gate oxide film for low voltage on the entire surface except for the dummy active region after forming the first and second isolation films; and forming a first polysilicon film for a floating gate electrode on the entire surface, patterning the first polysilicon film to form the floating gate electrode in the first region and a patterned polysilicon film in the third region, wherein the gate oxide film for high voltage and the patterned polysilicon film are stacked on the dummy active region.

2. The method as claimed in claim 1, wherein the triple well region includes a deep N well region, a P well region formed in a predetermined region of the deep N well region, and a N well region formed adjacent to the P well region.

3. The method as claimed in claim 2, wherein the P well region of the triple well region is located in the third region.

4. The method as claimed in claim 1, wherein the dummy active region is shifted about 0.1 to 0.5 μm toward the peripheral region at a boundary portion of the cell region and the peripheral region.

5. The method as claimed in claim 1, wherein the gate oxide film for high voltage is formed to a thickness of 360 to 440 Å.

6. The method as claimed in claim 1, wherein a well region for the peripheral region is formed within the semiconductor substrate of a predetermined region of the peripheral region.

7. The method as claimed in claim 6, further including the step of forming a field stop region within the semiconductor substrate of the peripheral region between the well region for the peripheral region and the triple well region of the cell region by performing a second ion implant process.

8. A method of manufacturing a flash memory device, the method comprising:

providing a semiconductor substrate comprising a first region where a cell region is formed, a second region where a peripheral region is formed, and a third region formed in the peripheral region at the boundary portion of the cell region and the peripheral region;

performing a first ion implant process to form a triple well region in the semiconductor substrate of a predetermined region of the first region, wherein an end portion of the triple well region is also formed in the third region;

forming a gate oxide film for high voltage on the semiconductor substrate of the third region;

forming a pattern for defining an isolation film of the cell region in the first region and a predetermined region of the third region, and forming a first trench only in the first region through patterning using the pattern;

forming additional patterns for defining isolation films of the peripheral region in predetermined regions of the second and third regions, performing patterning through the additional patterns to form a second trench deeper than the first trench only in the second region, wherein in the patterning for forming the first and second trenches, a dummy active region is formed in the third region in which the patterning is prevented;

forming a field stop well region within the semiconductor substrate of the peripheral region between the well region for the peripheral region and the triple well region of the cell region by performing a second ion implant process;

forming an insulating film for trench burial only within the first and second trenches, thus forming a first isolation film in the first region and a second isolation film, which is deeper than the first isolation film, in the second region;

forming a gate oxide film for low voltage on the entire surface except for the dummy active region; and forming a first polysilicon film for a floating gate electrode on the entire surface, patterning the first polysilicon film to form the floating gate electrode in the first region and a patterned polysilicon film in the third region, wherein the gate oxide film for high voltage and the patterned polysilicon film are stacked on the dummy active region.

9. The method as claimed in claim 8, wherein the triple well region includes a deep N well region, a P well region formed in a predetermined region of the deep N well region, and a N well region formed adjacent to the P well region.

10. The method as claimed in claim 9, wherein the P well region of the triple well region is located in the third region.

11. The method as claimed in claim 8, wherein the dummy active region is shifted about 0.1 to 0.5 μm toward the peripheral region at a boundary portion of the cell region and the peripheral region.

12. The method as claimed in claim 8, wherein the gate oxide film for high voltage is formed to a thickness of 360 to 440 Å.

13. The method as claimed in claim 8, wherein a well region for the peripheral region is formed within the semiconductor substrate of a predetermined region of the peripheral region.

* * * * *